(12) United States Patent
Oh et al.

(10) Patent No.: US 7,527,271 B2
(45) Date of Patent: May 5, 2009

(54) FAST SUBSTRATE LOADING ON POLISHING HEAD WITHOUT MEMBRANE INFLATION STEP

(75) Inventors: Jeonghoon Oh, Sunnyvale, CA (US); Andrew Nagengast, Sunnyvale, CA (US); Steven M. Zuniga, Soquel, CA (US); Hung Chih Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 39 days.

(21) Appl. No.: 11/757,069

(22) Filed: Jun. 1, 2007

(65) Prior Publication Data

US 2007/0289124 A1 Dec. 20, 2007

Related U.S. Application Data

(60) Provisional application No. 60/810,415, filed on Jun. 2, 2006.

(51) Int. Cl.
*B23B 31/30* (2006.01)
(52) U.S. Cl. .............................. 279/3; 269/21; 451/288
(58) Field of Classification Search .................... 279/3; 269/21; 451/288, 289, 388; 118/500; *B23B 31/30*
See application file for complete search history.

(56) References Cited

U.S. PATENT DOCUMENTS

| | | | | |
|---|---|---|---|---|
| 5,423,716 A * | 6/1995 | Strasbaugh | .................. | 451/388 |
| 5,762,751 A * | 6/1998 | Bleck et al. | ............ | 156/345.23 |
| 5,964,653 A * | 10/1999 | Perlov et al. | ................. | 451/288 |
| 5,993,302 A | 11/1999 | Chen et al. | | |
| 6,056,632 A * | 5/2000 | Mitchel et al. | .............. | 451/288 |
| 6,106,378 A * | 8/2000 | Perlov et al. | ................. | 451/288 |
| 6,156,124 A | 12/2000 | Tobin | | |
| 6,159,079 A | 12/2000 | Zuniga et al. | | |
| 6,183,354 B1 | 2/2001 | Zuniga et al. | | |
| 6,277,009 B1 * | 8/2001 | Chen et al. | ................... | 451/288 |
| 6,406,361 B1 * | 6/2002 | Zuniga et al. | ................ | 451/287 |
| 6,416,402 B1 * | 7/2002 | Moore | .......................... | 451/60 |
| 6,443,820 B2 * | 9/2002 | Kimura | ...................... | 451/285 |
| 6,514,124 B1 * | 2/2003 | Zuniga et al. | ................ | 451/41 |
| 6,547,641 B2 * | 4/2003 | Zuniga et al. | ................... | 451/8 |
| 6,652,362 B2 * | 11/2003 | Boo et al. | ...................... | 451/41 |
| 6,705,932 B1 | 3/2004 | Zuniga et al. | | |
| 6,722,965 B2 * | 4/2004 | Zuniga et al. | ................ | 451/288 |
| 6,848,980 B2 * | 2/2005 | Chen et al. | ................... | 451/285 |
| 6,857,945 B1 * | 2/2005 | Chen et al. | ................... | 451/288 |
| 6,890,402 B2 * | 5/2005 | Gunji et al. | ............ | 156/345.14 |

(Continued)

OTHER PUBLICATIONS

PCT International Search Report and Written Opinion dated Jul. 3, 2008 for International Application No. PCT/US2007/70243.

*Primary Examiner*—David P Bryant
*Assistant Examiner*—Eric A Gates
(74) *Attorney, Agent, or Firm*—Patterson & Sheridan

(57) ABSTRACT

The present invention relates to an apparatus and method for improving and speeding up substrate loading process. One embodiment provides a method for vacuum chucking a substrate. The method comprises venting a center chamber of a flexible membrane configured for mounting the substrate, moving the substrate such that a backside of the substrate is in full contact with the flexible membrane, and vacuuming the center chamber to vacuum chuck the backside of the substrate to the flexible membrane.

17 Claims, 6 Drawing Sheets

U.S. PATENT DOCUMENTS

| | | | |
|---|---|---|---|
| 7,210,991 B1 * | 5/2007 | Van Der Veen et al. | 451/285 |
| 2004/0127142 A1 | 7/2004 | Olgado et al. | |
| 2004/0266324 A1 * | 12/2004 | Bottema et al. | 451/285 |
| 2005/0037698 A1 | 2/2005 | Zuniga et al. | |
| 2005/0142993 A1 * | 6/2005 | Chen et al. | 451/287 |
| 2005/0176349 A1 | 8/2005 | Yilmaz et al. | |
| 2005/0211377 A1 | 9/2005 | Chen et al. | |

* cited by examiner

FAST SUBSTRATE LOADING ON POLISHING HEAD WITHOUT MEMBRANE INFLATION STEP

CROSS-REFERENCE TO RELATED APPLICATIONS

This application claims priority to United States Provisional Patent Application Ser. No. 60/810,415, entitled "Fast Substrate Loading on Polishing Head Without Membrane Inflation Step", filed Jun. 2, 2006, which is herein incorporated by reference in its entirety.

BACKGROUND OF THE INVENTION

1. Field of the Invention

Embodiments of the invention generally relate to an apparatus and method for loading a substrate on a carrier head.

2. Description of the Related Art

Sub-micron multi-level metallization is one of the key technologies for the next generation of ultra large-scale integration (ULSI). The multilevel interconnects that lie at the heart of this technology require planarization of interconnect features formed in high aspect ratio apertures, including contacts, vias, trenches and other features. Reliable formation of these interconnect features is very important to the success of ULSI and to the continued effort to increase circuit density and quality on individual substrates and die.

Planarization is generally performed using Chemical Mechanical Polishing (CMP) and/or Electro-Chemical Mechanical Deposition (ECMP). A planarization method typically requires that a substrate be mounted in a carrier head, with the surface of the substrate to be polished exposed. The substrate supported by the carrier head is then placed against a rotating polishing pad. The head holding the substrate may also rotate, to provide additional motion between the substrate and the polishing pad surface.

During planarization, a substrate is typically mounted on a carrier head by way of a vacuum chuck. A carrier head typically has an flexible membrane providing a mounting surface configured to receive the substrate from a backside. The flexible membrane may have one or more chambers connecting to a fluid source. When the fluid, such as air, is pumping into the chambers, the volume of the chambers will increase and the flexible membrane will be forced downwardly. On the other hand, when the fluid is pumped out of the chambers, the volume of the chambers will decrease and the flexible membrane will be forced up. To load the substrate, the carrier head generally moves to a position where the flexible membrane is positioned approximate the back side of the substrate. The flexible membrane is lowered by pumping fluid into the chambers and the mounting surface is positioned against the back side of the substrate. Fluid may then be pumped out of the chambers so that the flexible membrane may bow inwardly creating a low pressure pocket between the mounting surface and the back side of the substrate. The low pressure pocket will vacuum chuck the substrate to the carrier head.

FIGS. 1A-B schematically illustrate a typical substrate loading process used in the state of the art systems. A base member 102 is generally adapted to a carrier head (not shown). A flexible membrane 105 providing a substrate mounting surface 106 is mounted on the base member 102. The flexible membrane 105 has a center chamber 103 and an edge chamber 104. The center chamber 103 is configured to push out or draw in the mounting surface 106. The edge chamber 104 is generally configured to form a seal near an edge of a substrate 101 during the loading process.

As shown in FIG. 1A, both of the center chamber 103 and the edge chamber 104 is inflated by flowing fluid so that the mounting surface 106 is pressed against a backside 107 of the substrate 101. As the edge chamber 104 increases in volume, a seal may be formed between the mounting surface 106 and the backside 107 near the edge. Shown in FIG. 1B, the center chamber 103 may be deflated by pumping out fluid after the seal has been formed. The deflation of the center chamber 103 causing the mounting surface 106 to move upward. Because of the seal at the edge of the mounting surface 106, a volume of low pressure or vacuum will form between the mounting surface 106 and the backside 107 as the mounting surface moving upward forcing the substrate 101 against the mounting surface 106. The substrate 101 is, therefore, sealingly loaded on the flexible membrane 105. Because the substrate 101 is pushed downward around the edge to form the seal, and pulled upward by the vacuum force near the center, the substrate 101 goes through bowing deformation which introduces stress to the substrate and sometimes even breaks the substrate. A relatively large amount of fluid, such as control gas, must be moved to inflate the chambers and to pull vacuum from the inflated chambers.

Thus, the typical substrate loading process described above has at least two disadvantages. In one aspect, the loaded substrate usually goes through high bowing deformation causing occasional substrate breakage. In another aspect, inflating and deflating the flexible membrane requires moving relatively large volume of fluid which takes additional time.

Therefore, there is a need for an apparatus and method to improve the substrate loading process.

SUMMARY OF THE INVENTION

The present invention provides methods and apparatus for improved loading a substrate on a carrier head having flexible membrane.

One embodiment provides an apparatus for supporting a substrate. The apparatus comprises a base member having a bottom surface configured to provide support to the substrate and a plurality of recesses formed on the bottom surface, and a flexible membrane mounted on the base member, wherein a center chamber is formed between the base member and the flexible membrane and the center chamber may be deflated by a vacuum source.

Another embodiment provides a method for vacuum chucking a substrate. The method comprises venting a center chamber of a flexible membrane configured for mounting the substrate, moving the substrate such that a backside of the substrate is in full contact with the flexible membrane, and vacuuming the center chamber to vacuum chuck the backside of the substrate to the flexible membrane.

Yet another embodiment provides a method for loading a substrate. The method comprises providing a base member configured to provide support to the substrate, providing a flexible membrane mounted on the base member, wherein the flexible membrane includes a center chamber with the base member, pushing the substrate against flexible membrane to assist venting the center chamber, and vacuum chucking the substrate to the flexible membrane by pumping out the center chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention provides an apparatus and method to improve and speed up the substrate loading process. Apparatus of the present invention generally comprises a base member having a supporting surface and a plurality of recesses formed on the supporting surface. A flexible membrane is generally mounted on the base member, forming one or more chambers. The one or more chambers are usually vented before loading a substrate. The substrate is then positioned to be in contact with and pushed against the flexible membrane further venting the one or more chambers. The substrate may be pushed until the flexible membrane is in contact with the supporting surface of the base member and the substrate being supported by the base member. The chambers may then be vacuumed to form a plurality of low pressure pockets between the flexible membrane and the substrate, thus, loading the substrate on the flexible membrane. In this configuration, the substrate is supported by the supporting surface, thus, avoiding stress and breakage. The vacuum is pulled upon already vented chambers, thus, less fluid is being moved during the loading process.

Figure 1A:
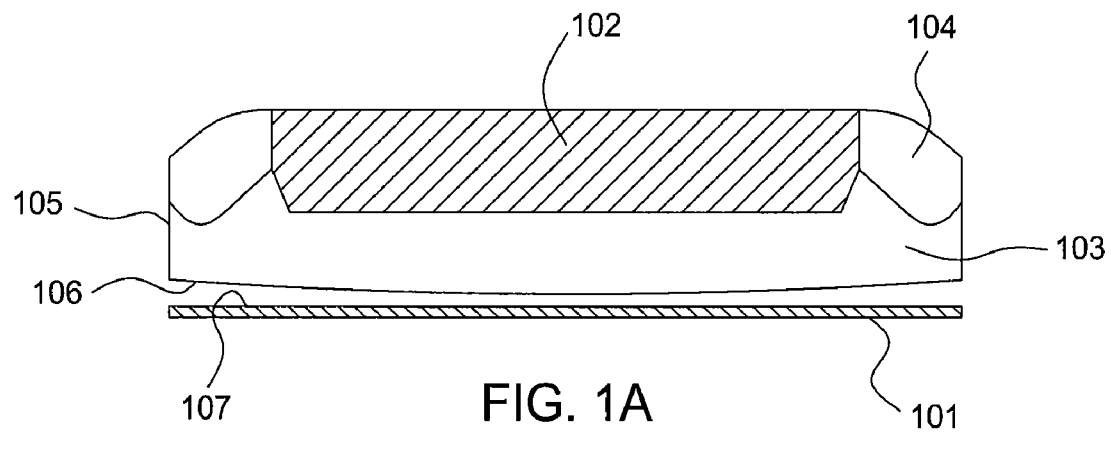
FIGS. 1A-B schematically illustrate a substrate loading process used in the state of art systems.
Figure 1B:
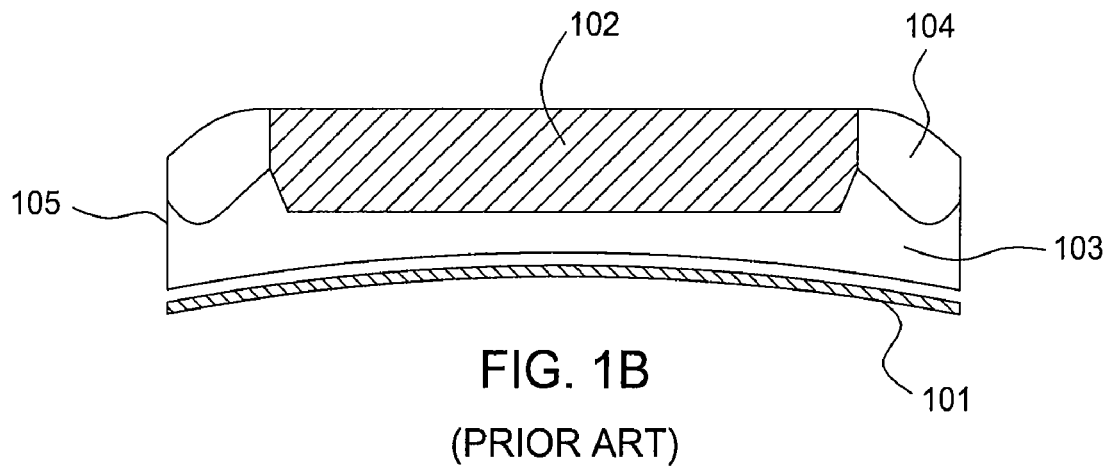
Figure 2:
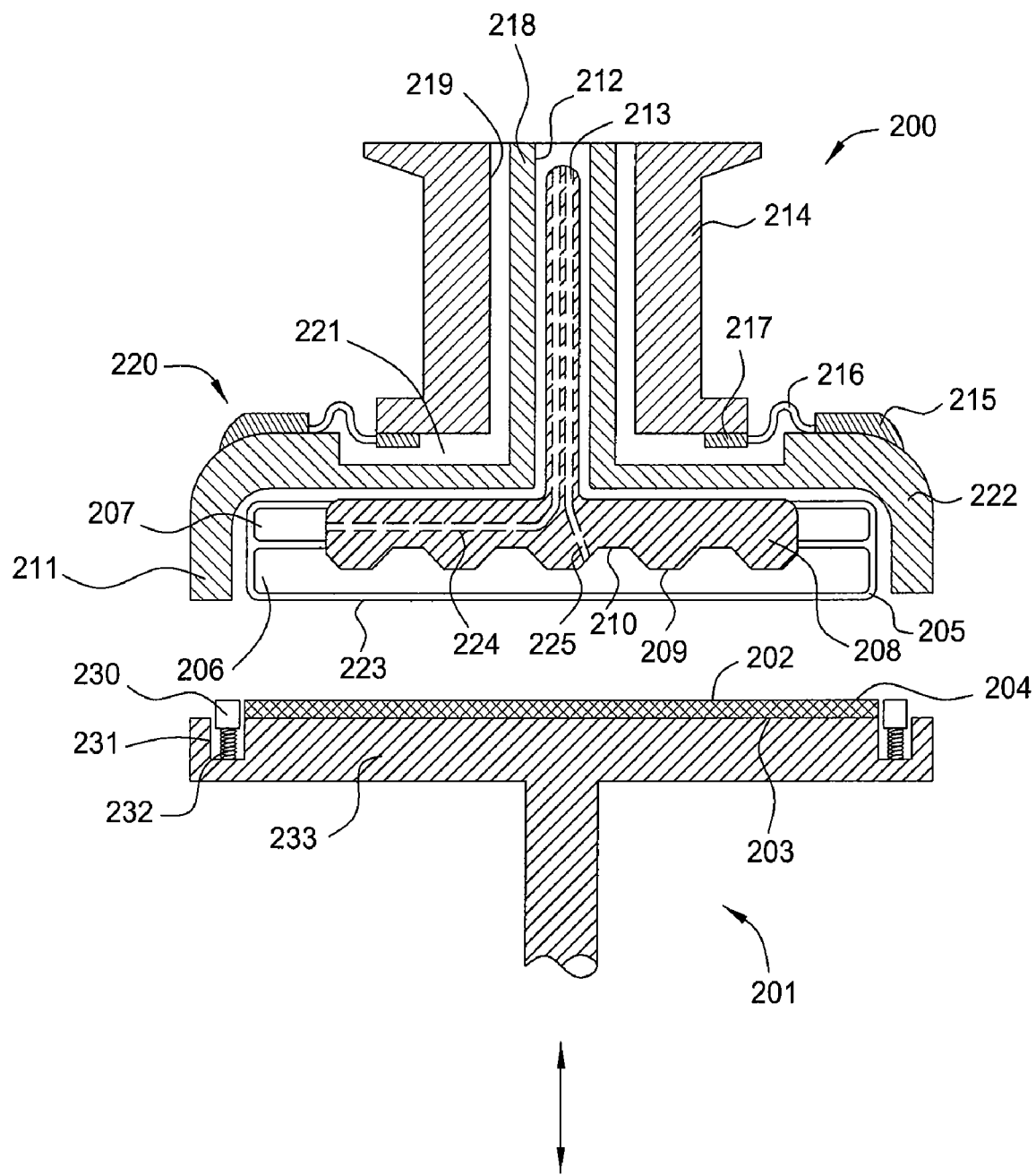
FIG. 2 schematically illustrates a sectional view of a carrier head and a substrate support in accordance with one embodiment of the present invention.

FIG. 2 schematically illustrates a sectional view of a carrier head 200 and a substrate support 201 in accordance with one embodiment of the present invention. The carrier head 200 is generally configured to hold a substrate 204 during polishing or other processing. In a polishing process, the carrier head 200 may hold the substrate 204 against a polishing pad and evenly distribute a downward pressure across a back surface 202 of the substrate 204.

The carrier head 200 generally comprises a housing 214, a base assembly 220, a loading chamber 221, and a retaining ring 211. Detailed description of a similar carrier head may be found in U.S. Pat. No. 6,183,354, entitled "Carrier Head with Flexible Membrane for Chemical Mechanical Polishing", and U.S. patent application Ser. No. 11/054,128, filed on Feb. 8, 2005, entitled "Multiple-Chamber Carrier Head with a Flexible Membrane", which are incorporated herein by reference.

The housing 214 is generally circular in shape and can be connected to a drive shaft (not shown) to rotate and or sweep therewith during polishing. A vertical bore 219 may be formed through the housing 214 allowing vertical movement for the base assembly 220.

The base assembly 220 is a vertically movable assembly located beneath the housing 214. The base assembly 220 comprises a generally rigid annular body 222, an outer clamp ring 215, and a gimbal rod 218 which slides vertically along the bore 219 to provide a vertical motion of the base assembly 220.

The loading chamber 221 is located between the housing 214 and the base assembly 220 to apply a load, i.e., a downward pressure or weight, to the base assembly 220. The vertical position of the base assembly 220 is also controlled by the loading chamber 221. An inner edge of a generally ring-shaped rolling diaphragm 216 may be clamped to the housing 214 by an inner clamp ring 217. An outer edge of the rolling diaphragm 216 may be clamped to the base assembly 220 by the outer clamp ring 215. The retaining ring 211 may be a generally annular ring secured at the outer edge of the base assembly 220. When fluid is pumped into the loading chamber 221 and the base assembly 220 is pushed downwardly.

The base assembly 220 further comprises a base member 208 configured to support a substrate loaded thereon. The base member 208 may be connected to a base rod 213 which is vertically movable along a bore 212 formed inside the gimbal rod 218. The base member 208 is generally a circular plate having a bottom surface 209 positioned substantially parallel to the substrate 204 to be loaded on. A plurality of recesses 210 may be formed on the bottom surface 209.

A flexible membrane 205 is generally clamped on the bottom surface 209 of the base member 208. The flexible membrane 205 provides a mounting surface 223 having approximately the same size of a substrate for mounting a substrate thereon. The flexible membrane 205 and the base member 208 may form multiple chambers, for example, a center chamber 206 and an edge chamber 207. In one embodiment, the base member 208 is a disk, the center chamber 206 has a substantially similar shape as the base member 208 and the edge chamber 207 is annular tube surrounding the base member 208. Fluid may be pumping into or from the center chamber 206 and the edge chamber 207 through passages 225 and 224 formed in the base member 208. The flexible membrane 205 and the mounting surface 223 may be lowered by pumping fluid into the center chamber 206. The flexible membrane 205 and the mounting surface 223 may be bowed inwardly by pumping fluid out of the center chamber 206. The edge chamber 207 is configured to push/pull an edge area of the mounting surface 223 by pumping in/out fluid.

The substrate support 201 is generally configured to support the substrate 204 on the back surface 202 facing the carrier head 200. In one embodiment, the substrate support 201 may comprise a pedestal 233 having a supporting surface 203 with reduced particle contamination configured to receive the substrate 204 therein. In one embodiment, the substrate support 201 comprises a plurality of retractable pins 230 disposed in a plurality of pin holes 231 formed in the pedestal 233 and opening to the supporting surface 203. Each of the plurality of the retractable pins 230 may be coupled to a spring 232. In one embodiment, the plurality of retractable pins 230 extend above the supporting surface 203 to form a barrier keeping the substrate 204 from lateral movement. The plurality of retractable pins 230 keep the substrate 204 within a location so that the substrate 204 stays aligned with the carrier head 200 during loading and unloading. In another embodiment, the plurality of retractable pins 230 may be extended above and retracted under the supporting surface 203 by other suitable mechanisms, such as pneumatic controls.

Figure 6:
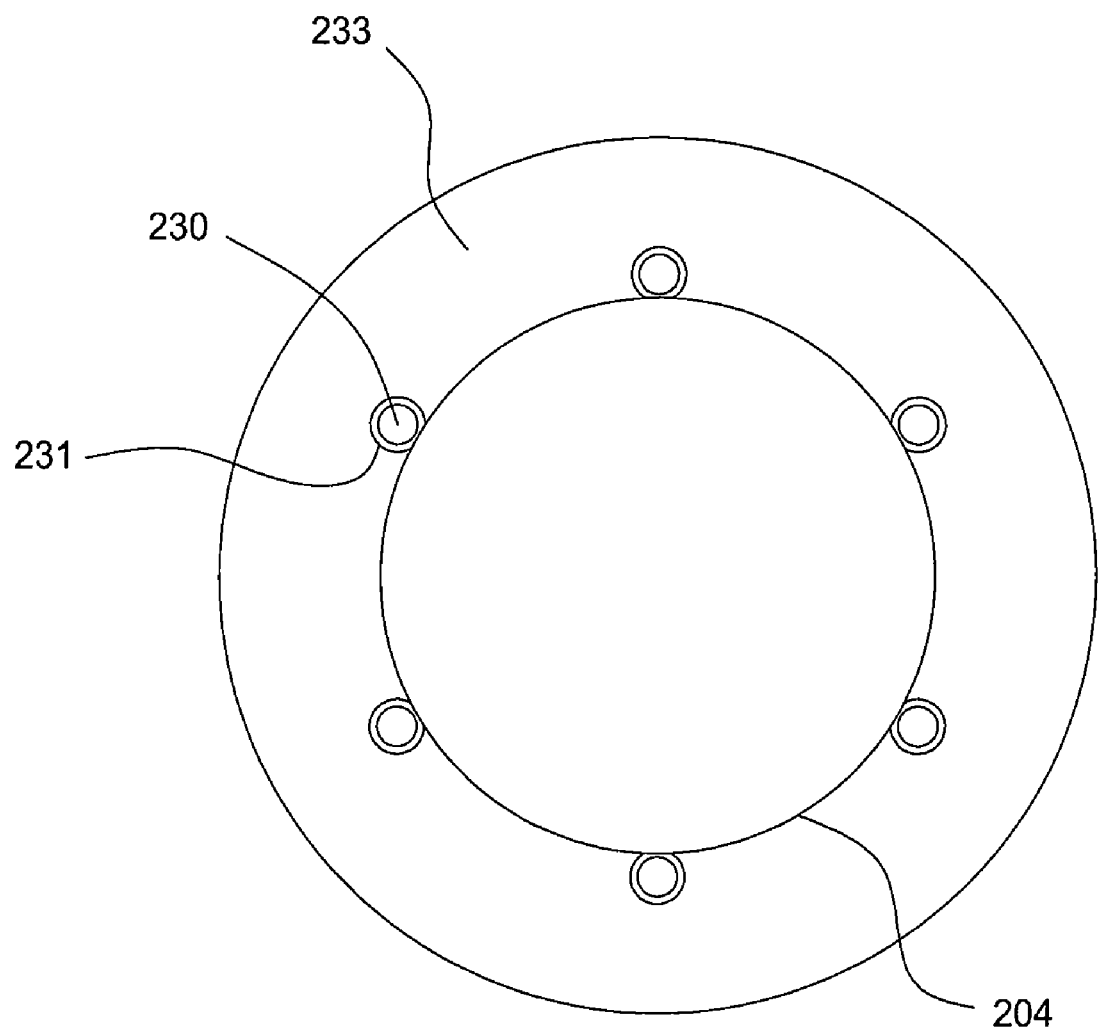
FIG. 6 schematically illustrates a top view of a substrate support in accordance with one embodiment of the present invention.

FIG. 6 schematically illustrates a top view of the substrate support 201. The plurality of pins 230 are arranged in a circle forming a restraint to retain the substrate 204 therein, as shown in FIG. 6. In one embodiment, there are six retractable pins 230 evenly distributed around a circle has a diameter equal to or slightly larger than an outer diameter of the substrate 204. In another embodiment, there are three retractable pins 230 forming a circle to retain the substrate 204.

Figure 3:
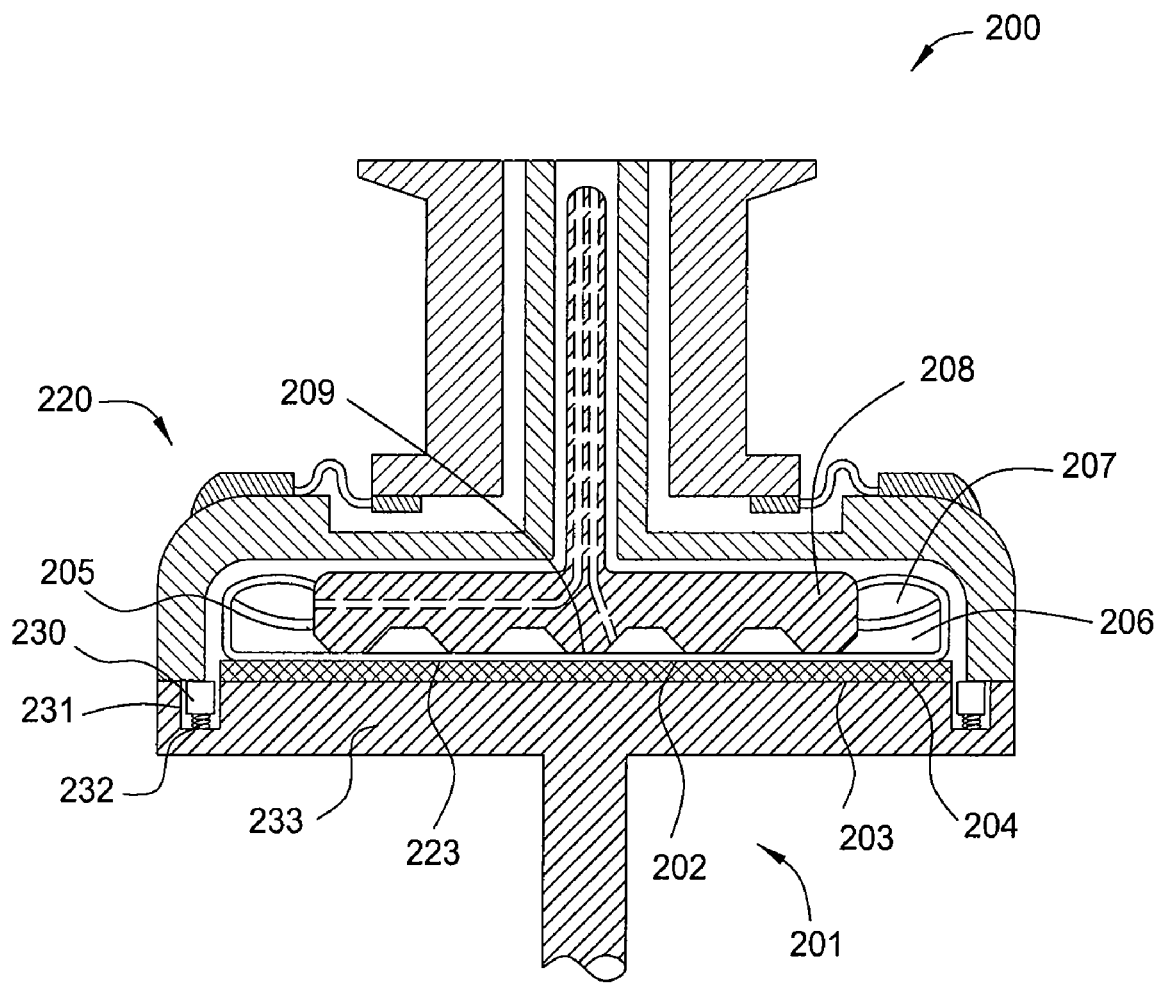
FIG. 3 schematically illustrates a sectional view of the carrier head of FIG. 2 in a substrate loading position.

Referring back to FIG. 2, the plurality of retractable pins 230 are extending above the supporting surface 203 when the springs 232 are in their natural position, so that the substrate 204 may be retained therein. During loading or unloading, the retaining ring 211 of the carrier head 200 contacts the plurality of retractable pins 230 and pressing the springs 232 allowing the retractable pins 230 to retract. In one embodiment, the plurality of retractable pins 230 may retract so that the top of each of the retractable pins 230 are even when the supporting surface 203 of the pedestal 233, as shown in FIG. 3.

In another embodiment, the substrate support 201 may be a load cup having an annular lip configured to support the substrate 204 near the edge and pressurized fluid to support the substrate 204 near the center. Detailed descriptions of a load cup may be found in U.S. patent application Ser. No. 10/988,647, filed on Nov. 15, 2004, entitled "Load Cup for Chemical Mechanical Polishing", and U.S. patent application Ser. No. 10/621,303, filed on Jul. 16, 2003, entitled "Load Cup for Chemical Mechanical Polishing", which are incorporated herein as references.

As shown in FIG. 2, before loading the substrate 204 on the mounting surface 223, both of the edge chamber 207 and the center chamber 206 are vented. To load the substrate 204, the carrier head 200 and the substrate support 201 are moved toward each other into a loading position shown in FIG. 3. The substrate 204 is retained in a position by the plurality of retractable pins 230 so that the substrate 204 stays aligned with the carrier head 200. In the loading position, the carrier head 200 approaches the substrate support 201 so that the substrate 204 is within the retaining ring 211 of the carrier head 200. In the loading position, the substrate 204 is pushed against the carrier head 200 so that the flexible membrane 205 is pushed against the bottom surface 209 of the base member 208 by a controlled force. The center chamber 206 may be further vented as the substrate 204 moving to the loading position forcing more fluid out of the center chamber 206. In the loading position, the back surface 202 of the substrate 204 is full contact with the mounting surface 223 on the flexible membrane 205 and the flexible membrane 205 is in contact with the bottom surface 209 of the base member 208 such that the substrate 204 is supported by the base member 208. In one embodiment, moving the substrate 204 to loading position may be performed by raising the substrate support 201, lowering the carrier head 200, lowering the base assembly 220, or the combination thereof. In one embodiment, the substrate 204 is pushed against the carrier head 200 by a force of about 30 lb.

Figure 4:
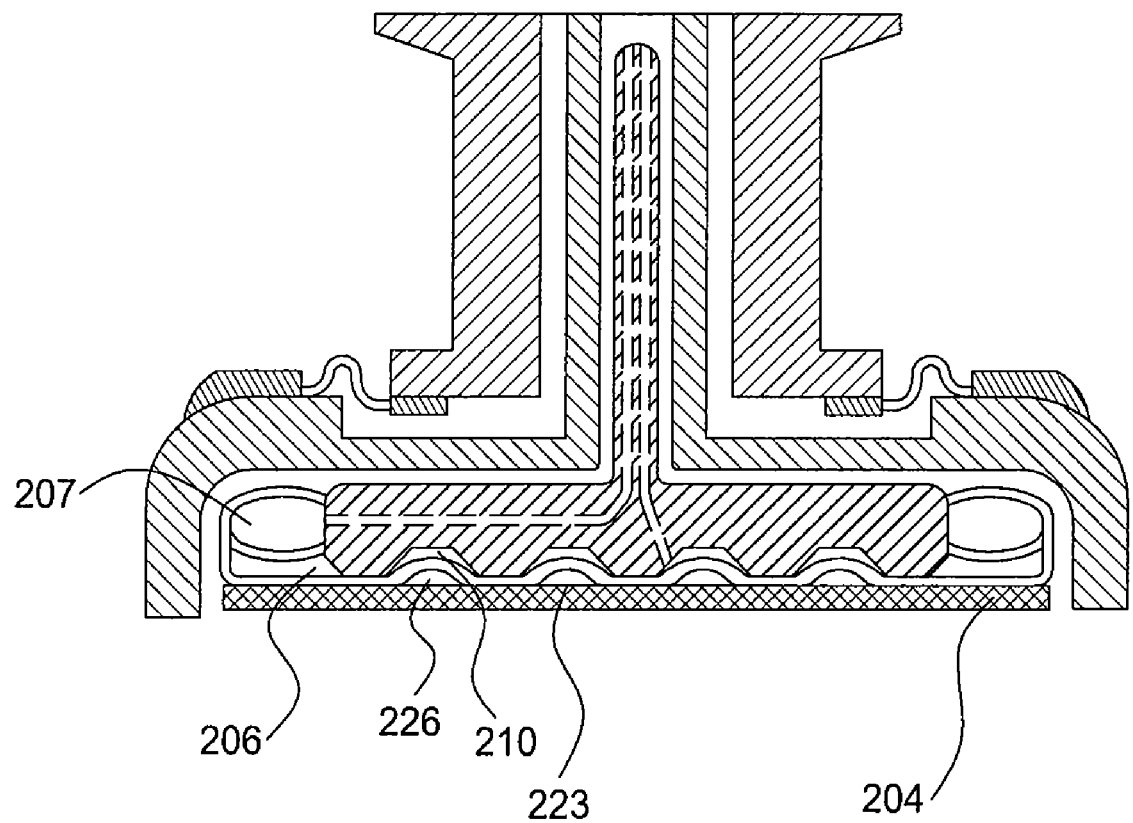
FIG. 4 schematically illustrates a sectional view of the carrier head of FIG. 2 in a substrate loaded position.

After the substrate 204 is moved into the loading position. The substrate 204 may be loaded using the edge chamber 207 and the center chamber 206. FIG. 4 schematically illustrates a sectional view of the carrier head 200 in a substrate loaded position. In one embodiment, the loading process may be conducted in two steps. First, fluid may be pumped into the edge chamber 207 to inflated the edge chamber 207. The fluid pressure inside the inflated edge chamber 207 pushes the flexible membrane against the back surface 202 of the substrate 204 near the edge, therefore, forming a seal between the substrate 204 and the flexible membrane 205. After the seal has been formed, fluid may be pumped out the center chamber 206 so that part of the flexible membrane 205 retracts into the plurality of recesses 210 forming a plurality of vacuum pockets 226 between the back surface 202 and the mounting surface 223. The vacuum pockets 226 provide a suction force and the substrate 204 may be lifted away from the substrate support 201 and loaded onto the carrier head 200.

Because the center chamber 206 is vented before the substrate 204 is positioned in the loading position, and is further vented when the substrate 204 is pushed against the base member 208, the volume of fluid needed to be pumped out from the center chamber 206 to form the vacuum pockets 226 is reduced, therefore, the time for loading is reduced.

Figure 5:
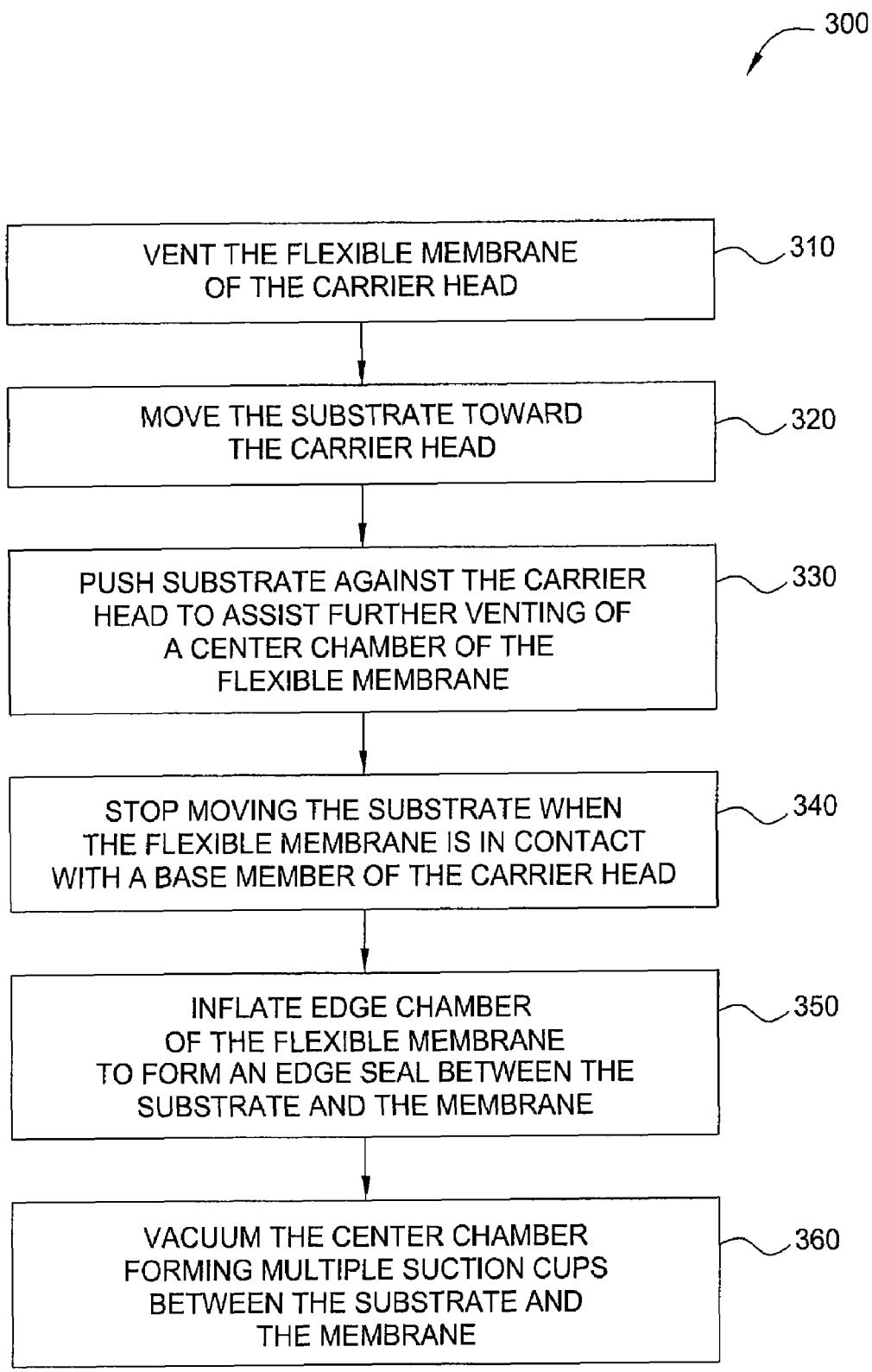
FIG. 5 illustrates a flow chart of a substrate loading process in accordance with one embodiment of the present invention.

Since the substrate 204 is not only supported near the edge by the inflated edge chamber 207, but also supported in the center by the base member 208, the substrate 204 remains flat and unbowed in the loading process FIG. 5 illustrates a flow chart of a substrate loading process 300 in accordance with one embodiment of the present invention. The loading process 300 may be used to load a substrate on a carrier head having a flexible membrane mounted on a base member, wherein at least a center chamber and an edge chamber is formed by the flexible membrane.

In step 310, the flexible membrane may be vented. The venting of the membrane may include venting the center chamber and the edge chamber. For chambers inflated by a gas, the venting may be simply achieved by connecting the chambers to the atmospheric environment.

In step 320, a substrate to be loaded is moved toward the carrier head. The moving of the substrate may be performed by raising a substrate support on which the substrate is positioned, lowering the carrier head, lowering the base member of the carrier head, or the combination thereof.

In step 330, the substrate is continuously moved and pushed against the flexible membrane by a controlled force further venting the center chamber of the flexible membrane.

In step 340, the movement of the substrate is stopped when the flexible membrane is in full contact with the base member. In one embodiment, a pressure sensor may be positioned on the base member to determine an end point to stop moving the substrate. In another embodiment, the substrate may stop moving when a predetermined threshold pushing force has been reached.

In step 350, the edge chamber is inflated to form an edge seal between the substrate and the flexible membrane. A predetermined pressure of the edge chamber may be set to achieve necessary seal.

In step 360, vacuum is applied to the center chamber to form multiple suction cups between the substrate and the membrane, thus, vacuum chucking the substrate. A vacuum source such as a pump may be used to pump fluid out of the already vented center chamber.

It should be noted although the substrate loading process of the present invention is described in accordance with a carrier head for a polishing system, a person skilled in the art may apply the invention in substrate loading steps of other processing systems.

While the foregoing is directed to embodiments of the present invention, other and further embodiments of the invention may be devised without departing from the basic scope thereof, and the scope thereof is determined by the claims that follow.

What is claimed is:

1. A method for loading a substrate, comprising:
providing a base member configured to provide support to the substrate;
providing a flexible membrane mounted on the base member, wherein the flexible membrane forms a center chamber with the base member, and the flexible membrane forms an edge chamber around the base member;
pushing the substrate against the flexible membrane to assist venting of the center chamber;
prior to vacuum chucking the substrate, inflating the edge chamber to form a seal between the substrate and the flexible membrane; and
vacuum chucking the substrate to the flexible membrane by pumping out the center chamber.

2. The method of claim 1, further comprising, prior to pushing the substrate, venting the center chamber and the edge chamber.

3. The method of claim 1, further comprising, prior to pushing the substrate, venting the center chamber.

4. The method of claim 1, wherein pushing the substrate is performed using a controlled force.

5. The method of claim 1, wherein pushing the substrate against the flexible membrane comprises pushing the substrate until the flexible membrane is in contact with a bottom surface of the base member.

6. The method of claim 1, further comprising providing a substrate support configured to push the substrate against the flexible membrane.

7. A method for vacuum chucking a substrate, comprising:
venting a center chamber of a flexible membrane configured for mounting the substrate;
venting an edge chamber of the flexible membrane;
moving the substrate such that a backside of the substrate is in full contact with the flexible membrane;
prior to vacuuming the center chamber, inflating the edge chamber to form a seal between the substrate and the flexible membrane; and
vacuuming the center chamber to vacuum chuck the backside of the substrate to the flexible membrane.

8. The method of claim 7, further comprising positioning a substrate on a substrate support in a face down position.

9. The method of claim 8, wherein moving the substrate comprises:
raising the substrate towards the flexible membrane; and
pushing the substrate against the flexible membrane to force venting the center chamber.

10. The method of claim 9, wherein raising and pushing the substrate is performed by the substrate support.

11. The method of claim 7, further comprising stopping the substrate when a predetermined force is applied to the substrate by the flexible membrane.

12. A method for loading a substrate, comprising:
providing a base member configured to provide support to the substrate;
providing a flexible membrane mounted on the base member, wherein the flexible membrane forms a center chamber with the base member, and the flexible membrane forms an edge chamber around the base member;
prior to pushing the substrate, venting the center chamber and the edge chamber;
pushing the substrate against the flexible membrane to assist venting of the center chamber; and
vacuum chucking the substrate to the flexible membrane by pumping out the center chamber.

13. The method of claim 12, wherein pushing the substrate against flexible membrane comprises:
positioning the substrate on a substrate support;
raising the substrate support and/or lowering the base member to push the substrate against the flexible membrane.

14. The method of claim 13, wherein pushing the substrate against the flexible membrane further comprises:
stopping at an end point.

15. The method of claim 14, wherein the end point is determined by a pressure sensor positioned in the base member.

16. The method of claim 14, wherein the end point is when a predetermined threshold pushing force is reached.

17. The method of claim 14, further comprising: prior to vacuum chucking the substrate, inflating the edge chamber to form a seal between the substrate and the flexible membrane.

* * * * *